United States Patent [19]

Takahashi

[11] Patent Number: 4,498,025
[45] Date of Patent: Feb. 5, 1985

[54] TUNING FORK

[75] Inventor: Kunihiro Takahashi, Tokyo, Japan

[73] Assignee: Seiko Instruments & Electronics Ltd., Tokyo, Japan

[21] Appl. No.: 323,488

[22] Filed: Nov. 20, 1981

[30] Foreign Application Priority Data

Dec. 12, 1980 [JP] Japan .................................. 55-175604
Jul. 2, 1981 [JP] Japan .................................. 56-104304

[51] Int. Cl.³ ............................................ H01L 41/08
[52] U.S. Cl. ...................................... 310/312; 310/370
[58] Field of Search .......... 310/312, 361, 370, 365–366

[56] References Cited

U.S. PATENT DOCUMENTS

| 3,697,766 | 10/1972 | Ganter et al. ............... | 310/370 X |
| 4,076,987 | 2/1978 | Zumsteg ....................... | 310/361 |
| 4,320,320 | 3/1982 | Momosaki et al. .......... | 310/312 X |
| 4,377,765 | 3/1983 | Kogure et al. ................ | 310/370 X |

FOREIGN PATENT DOCUMENTS

| 0032695 | 3/1977 | Japan ........................... | 310/370 |
| 2006520 | 5/1979 | United Kingdom ......... | 310/370 |

OTHER PUBLICATIONS

Tomikawa et al., "Second–Mode Tuning Forks for High Frequencies: Finite Element Analysis and Experiments", *IEEE Transactions on Sonics and Ultrasonics,* vol. SU-14 27, No. 5, (Sep. 1980), pp. 253–257.

Primary Examiner—Peter S. Wong
Attorney, Agent, or Firm—Robert E. Burns; Emmanuel J. Lobato; Bruce L. Adams

[57] ABSTRACT

A tuning fork utilizing elastic coupling between the flexural mode and the torsional mode in which the frequency of the flexural mode is adjusted by adding or reducing masses deposited near the center of the arms in the lengthwise direction and the frequency of the torsional mode is adjusted by adding or reducing masses deposited on the other portions such as the tops of the arms. The positions near the center of the arms in the lengthwise direction are suitably selected so that adding or reducing the masses thereto or therefrom changes only the frequency of the flexural mode changes only and the frequency of the torsional mode is scarcely changed.

20 Claims, 23 Drawing Figures

CROTCH          TOP
→ POSITION OF THE ARM

TUNING FORK

BACKGROUND OF THE INVENTION

The present invention relates to a tuning fork utilizing a coupling between the flexural mode and the torsional mode.

Recently the accuracy rating of wrist watches has shifted from the monthly rate to the yearly rate. And tuning forks utilizing the coupling between the flexural mode and the torsional mode have been considered as resonators for wrist watches capable of achieving a high accuracy yearly rate. In this method, it is necessary to select an appropriate degree of coupling to attain an excellent frequency-temperature characteristic. The degree of coupling is determined by the difference in frequency between the flexural mode and the torsional mode. The frequency of the flexural mode depends on the length and width of the resonators. The frequency of the torsional mode depends on the length, width and thickness of the resonators. So that, in order to attain the appropriate degree of coupling, it is necessary to set the thickness dimension of the resonators at the optimum value. Actually, however, since the dispersion in the thickness dimension is too large in the case of mass-produced resonators, it is impossible to set the frequency difference between two modes at the appropriate value only by controlling the thickness dimension. Therefore, the frequency difference between two modes is controlled by depositing masses for frequency adjustment.

To set the frequency difference between two modes at the appropriate value, a frequency adjustment for changing the frequency of one mode without changing the frequency of the other mode is needed.

Figures 1, 2, 3, 4:
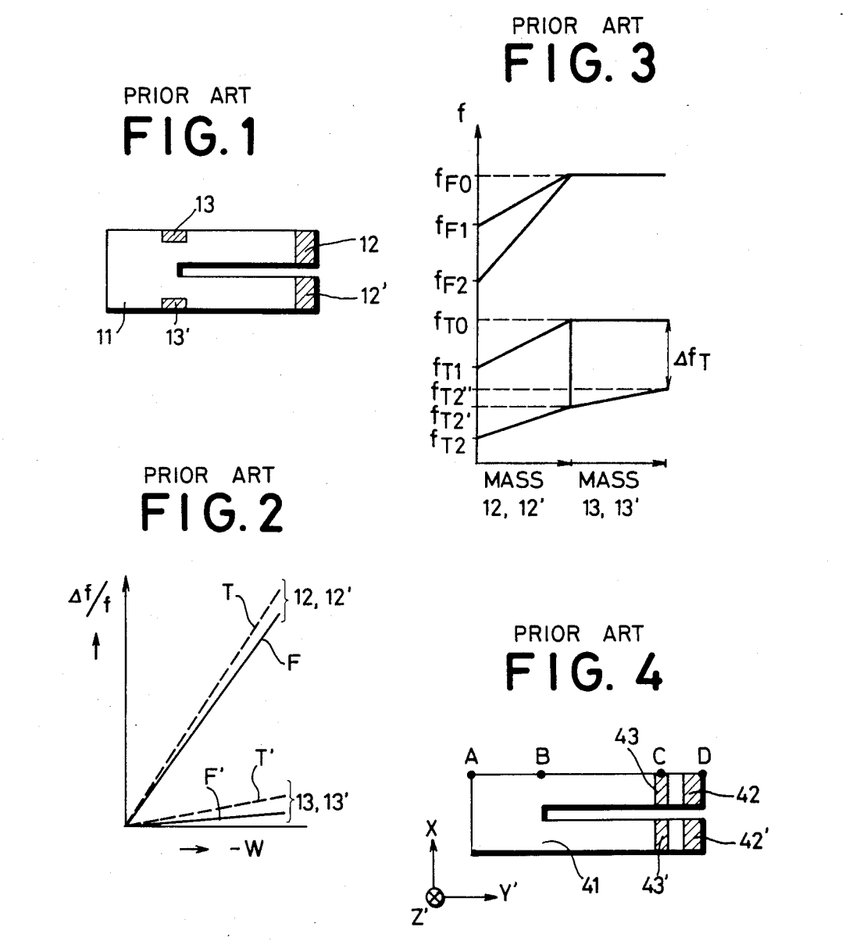
FIG. 1 is a plan view of a resonator showing the position of conventional masses for frequency adjustment of a quartz tuning fork utilizing coupling between the fundamental flexural mode and the fundamental torsional mode.
FIG. 2 is a characteristic diagram showing the frequency change of the flexural mode and the torsional mode caused by changing the masses shown in FIG. 1.
FIG. 3 is a characteristic diagram showing the frequency changes of the flexural mode and the torsional mode in the case the two kinds of masses shown in FIG. 1 are scattered in turn.
FIG. 4 is a plan view of a resonator showing the positions of the conventional masses for frequency adjustment of quartz tuning fork utilizing the coupling between the second flexural mode and the fundamental torsional mode.

FIG. 1 shows the conventional example of masses in the quartz tuning fork utilizing a coupling between the fundamental flexural mode and the fundamental torsional mode, in which reference numeral 11 denotes a quartz tuning fork, 12 and 12' denote masses deposited on the tops of the arms, 13 and 13' denote masses deposited near a crotch. The masses 12 and 12' are for adjusting the frequency of the flexural mode. The quartz tuning fork aims to improve the frequency-temperature characteristic of the flexural mode by utilizing the coupling between the flexural mode and the torsional mode. The masses 12 and 12' are for adjusting the oscillating frequency of the flexural mode. The masses 13 and 13' are for changing only the frequency of the torsional mode, while the frequency of the flexural mode is little changed. Namely, a frequency-temperature characteristic having an excellent flexural mode is attained by setting the frequency difference between two modes at the appropriate value.

FIG. 2 shows frequency changes in the flexural mode and the torsional mode in the case the masses (Au) 12, 12' at the tops of the arms and the masses (Au) 13, 13' at the crotch in FIG. 1 are scattered by laser. The abscissa indicates the scattered amount W of the masses and the ordinate indicates the frequency changes $\Delta f/f$ in the flexural mode and the torsional mode. In FIG. 2, F and T respectively indicate the frequency changes in the flexural mode and the torsional mode in the case the mass values of masses 12 and 12' in FIG. 1 are scattered, and F' and T' respectively indicate the frequency changes in the flexural mode and the torsional mode in the case the mass values of masses 13 and 13' are scattered. As understood from FIG. 2, large frequency changes in both the modes are found when the values of the masses 12 and 12' at the tops of the arms are scattered. Therefore the masses on the tops of the arms are the most suitable to adjust the oscillating frequency of the flexural mode. On the other hand, when the values of the masses 13 and 13' near the crotch are scattered, the frequency changes in both the modes are small. The masses 13 and 13' are deposited to largely change the frequency of the torsional mode alone without changing the frequency of the flexural mode. Actually, however, since the frequency change in the torsional mode is very small, the masses 13, 13' scarcely adjust the frequency-temperature characteristic of the flexural mode.

FIG. 3 shows the condition of the frequency adjustment in the case the masses in FIG. 1 are scattered by laser. The ordinate f indicates the frequency and the abscissa indicates the scattered amount of the masses 12, 12' and that of the masses 13, 13' added together. $fF_0$ and $fT_0$ on the ordinate respectively indicate the desired value of the frequency of the flexural mode and the desired value of the frequency of the torsional mode. The frequencies of the flexural mode and the torsional mode of a number of resonators are respectively dispserse between $fF_1$ and $fF_2$, and between $fT_1$ and $fT_2$ by dispersion in dimensions and cut angles of the finished resonators.

Initially the masses 12 and 12' are scattered to set the frequency of the flexural mode at the desired value $fF_0$. At this time the frequency of the torsional mode also increases, but the dispersion in frequency of the finished resonator is kept substantially as it is. Then the masses 13 and 13' are scattered to set the frequency of the torsional mode at the desired value $fT_0$. However, the frequency of the torsional mode does not largely change even if the masses 13, 13' are scattered as shown in FIG. 2. Since the lowest frequency $fT_2'$ within the frequency dispersion of the torsional mode merely changes into $fT_2''$, it is impossible that the frequencies of the torsional mode of all the resonators are set at the desired value $fT_0$.

FIG. 4 shows the conventional example of the position of the masses in the quartz tuning fork utilizing a coupling between the second flexural mode and the fundamental torsional mode. Reference numeral 41 denotes a quartz tuning fork, 42 and 42' denote masses deposited on the tops of the arms, 43 and 43' denote masses deposited near a node of the second flexural mode. In the figures, A, B, C and D indicates the positions of the quartz tuning fork at the tops in the width direction. A, B, C and D respectively denote an end of the base, a crotch, a node of the second flexural mode, and a top of the arm of the quartz tuning fork.

Figure 5:
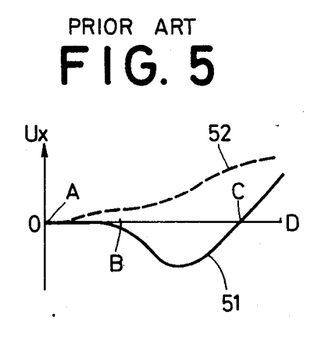
FIG. 5 is a displacement distribution diagram of the flexural mode and the torsional mode of the quartz tuning fork shown in FIG. 4.

FIG. 5 shows a displacement of the second flexural mode and the fundamental torsional mode in the quartz tuning fork. Reference numeral 51 denotes a displacement of the second flexural mode in the X direction (width direction) of a straight line AD shown in FIG. 4. The displacement in the X direction of the second flexural mode at a point C is zero, and the point C is a node of the second flexural mode. Reference numeral 52 denotes a displacement in the Z' direction (thickness direction) of the fundamental torsional mode of the straight line AD in FIG. 4. The displacement constituent of the torsional mode in the Z' direction is the largest of the displacement constituents in the X, Y' and Z' directions. In the case the masses are deposited on a portion where the displacement of some mode is large, the masses are effective to change the frequency of the mode. Namely, it is easily assumed that the masses adjacent to the node C of the flexural mode do not largely affect the frequency of the flexural mode but substantially change the frequency of the torsional mode alone. So the masses 42 and 42' in FIG. 4 are for adjustment of the oscillating frequency of the flexural mode. On the other hand, the masses 43, 43' slightly change the frequency of the flexural mode but substantially change only the frequency of the torsional mode. Namely, the masses are deposited on the arms to attain the excellent frequency-temperature characteristic of the flexural mode by setting the difference in frequency between the flexural mode and the torsional mode at the appropriate value.

Figure 6:
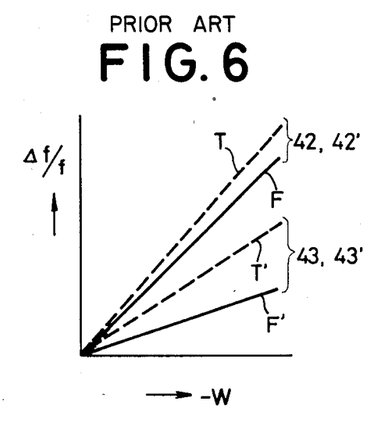
FIG. 6 is a characteristic diagram showing the frequency change of the flexural mode and the torsional mode caused by changing the masses shown in FIG. 4.

FIG. 6 shows frequency changes of the flexural mode and the torsional mode when the masses (Au) 42, 42' at the tops of the arms and the masses (Au) 43, 43' near the node of the flexural mode shown in FIG. 4 are scattered by laser. The abscissa indicates the scattered amount W of the masses, and the ordinate indicates the frequency changes $\Delta f/f$ of the flexural mode and the torsional mode. In FIG. 6, F and T respectively indicate frequency changes of the flexural mode and the torsional mode when the masses 42 and 42' shown in FIG. 4 are scattered. F' and T' respectively indicate frequency changes of the flexural mode and the torsional mode when the masses 43 and 43' are scattered. As understood from FIG. 6, the masses at the tops of the arms are sufficient for the masses to adjust the oscillating frequency of the flexural mode. When the masses 43 and 43' at the node of the second flexural mode are scattered, the frequency change in the torsional mode is naturally large, while the frequency change in the flexural mode is also exceedingly large. The masses 43 and 43' are deposited on the arms in order to largely change the frequency of the torsional mode alone without changing the frequency of the flexural mode. Actually, however, the frequency of the flexural mode also largely change simultaneously with the frequency change in the torsional mode. It shows that the masses 43 and 43' are not sufficient to adjust the frequency-temperature characteristic of the flexural mode accurately.

Figure 7:
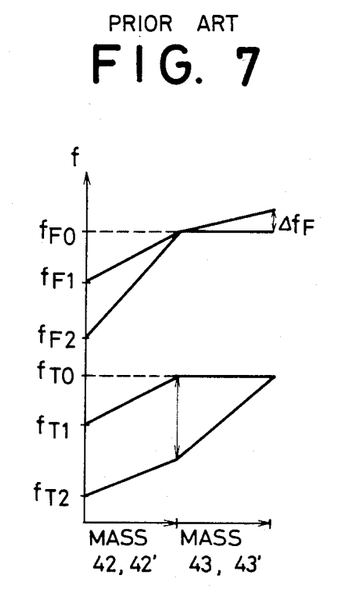
FIG. 7 is a characteristic diagram showing the frequency changes of the flexural mode and the torsional mode in the case the two kinds of masses shown in FIG. 4 are scattered in turn.

FIG. 7 shows the frequency adjustment condition of the masses shown in FIG. 4 scattered by laser. The ordinate indicates the frequency and the abscissa indicates the scattered amount of the masses 42 and 42' connected in series with the scattered amount of the masses 43 and 43'. The frequences $fF_0$, $fF_1$, $fF_2$, $fT_0$, $fT_1$ and $fT_2$ are defined in the same way as in FIG. 3. The masses 42 and 42' are scattered by laser to set the frequency of the flexural mode at the desired value $fF_0$. Then the frequency of the torsional mode also increases, but the frequency dispersion in the completed resonator is kept substantially as it is.

Next the frequency of the torsional mode is set at the desired value $fT_0$ by scattering the masses 43 and 43'. However, the frequency of the flexural mode changes when the masses 43 and 43' are scattered as shown in FIG. 6. As a result, the frequency of the flexural mode scatters by $\Delta fF$ after the frequency of the torsional mode is set at the desired value $fT_0$ with respect to all the resonators as shown in FIG. 7. When the dispersion is within several ppm, a capacitor for adjustment of frequency deviation incorporated into the oscillating circuit is set at the appropriate value so that the final adjustment of frequency deviation, as in a wrist watch application may be made. Actually, however, the value of $\Delta fF$ is no less than several thousand ppm after the masses 43, 43' are scattered to adjust the frequency of the torsional mode. As a result, the difference in frequency between the flexural mode and the torsional mode disperses and consequently the frequency-temperature characteristic also disperses. Further, since the final adjustment of frequency deviation cannot be performed only by the capacitor for adjustment of frequency deviation, a wrist watch of high accuracy cannot be realized. For absorbing the dispersion of $\Delta fF$, electrical logical correction using a logic circuit has been considered. This method is disadvantageous in that the structure for a required IC is complicated and the cost thereof is increased.

As illustrated, considerable drawbacks attend the use of conventional masses for frequency adjustment shown respectively in FIG. 1 in which the coupling between the fundamental flexural mode and the fundamental torsional mode is utilized, and in FIG. 4 in which the couping between the second flexural mode and the fundamental torsional mode is utilized. Namely, in the former case, it is impossible to adjust the frequency of the torsional mode for absorbing the dispersion in the thickness dimension of the resonator, and in the latter case, the frequency of the flexural mode largely disperses after the frequency of the torsional mode is adjusted.

BRIEF SUMMARY OF INVENTION

The present invention aims to eliminate the above noted drawbacks, and therefore it is an object of the present invention to provide a tuning fork utilizing coupling between the flexural mode and the torsional mode, in which the frequency of the torsional mode can be changed sufficiently, dispersion in the frequency of the flexural mode is inhibited after adjustment of the frequency difference between the flexural mode and the torsional mode is carried out, an electrical logic correction is not used, and exceedingly simple and inexpensive frequency adjustment is carried out.

BRIEF DESCRIPTION OF THE DRAWINGS

FIG. 9 is a sectional view of the quartz tuning fork shown in FIG. 8, FIGS. 10, 11 and 12 are respectively characteristic diagrams showing the relationship between the positions of the masses 82 and 82', 83 and 83', and 84 and 84' evaporated on the arms in the width direction shown in FIG. 8 and the frequency change of the torsional mode.

DETAILED DESCRIPTION OF THE INVENTION

Figure 8:
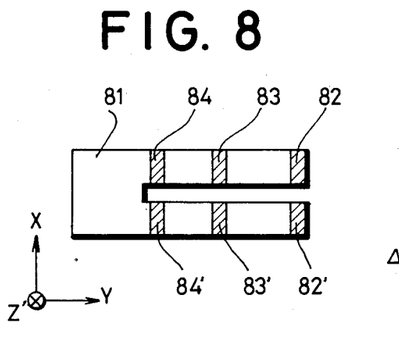
FIG. 8 is a plan view of a resonator showing the positions of the masses of the quartz tuning fork.

FIG. 8 shows a plan view of a quartz tuning fork 81. The width, the length and the thickness directions of the tuning fork are respectively in the X-axis (electrical axis of quartz), Y'-axis and Z'axis. Oblique lined portions 82, 82' represent masses deposited on the tops of the arms, 83, 83' represent masses deposited near the center in the lengthwise direction of the arms, and 84, 84' represent masses deposited near the upper crotch of the arms. The quartz tuning fork utilizes coupling between the second flexural mode and the fundamental torsional mode. The node of the flexural mode indicated by C in FIG. 5 is located midway between the masses 82 and 83 in FIG. 8. The masses are deposited on the oblique lined portions 82, 82', 83, 83', 84 and 84' in FIG. 8 by evaporation.

Figure 9:
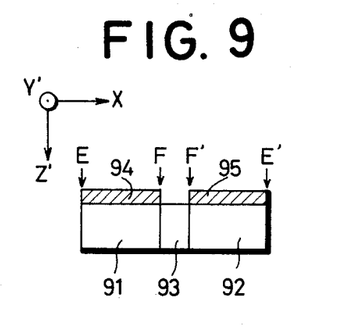

FIG. 9 illustrates a section of the quartz tuning fork of FIG. 8 viewed from the plus Y'axis direction. Reference numerals 91 and 92 denote arms, and 93 denotes a crotch. Tops of one arm in the width direction are represented by E and F, and tops of the other arm in the same direction are represented by E' and F'. The oblique lined portions 94 and 95 denote the masses deposited by evaporation.

Figure 10:
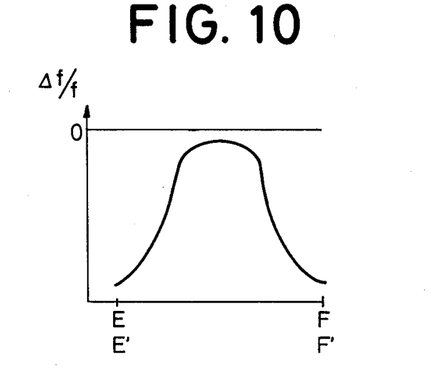

FIG. 10 shows a frequency change of the torsional mode in the case the masses (Au) are deposited on the oblique lined portions 82 and 82' at the tops of the arms shown in FIG. 8 by evaporation. The ordinate indicates the rate of frequency change after evaporation standardized on the frequency of the torsional mode before evaporation, in which the direction of the arrow mark is positive. The abscissa indicates the position of the arms in the width direction shown in FIG. 9. Namely, FIG. 10 shows the rate of frequency change of the torsional mode on the basis of the frequency without depositing the masses when the masses of the same amount are deposited on the positions indicated by the abscissa by evaporation. As understood from the drawing, the amound of frequency change of the torsional mode by the masses depends on the position of the masses on the arms in the width direction. Namely, the amount of frequency change of the torsional mode by the masses is large when the masses are deposited on the tops of the arms in the width direction, and is exceedingly small when the masses are deposited near the center of the arms in the width direction. In all, the frequency of the torsional mode largely decreases by depositing the masses on the positions 82 and 82' shown in FIG. 8 by evaporation.

Figure 11:
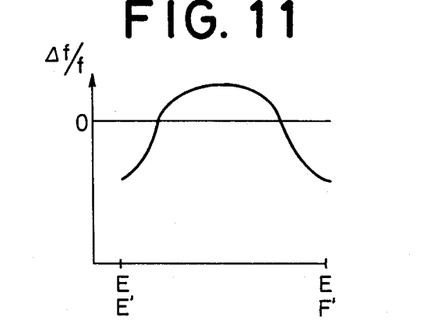

FIG. 11 shows the frequency change of the torsional mode when the masses are deposited on the oblique lined portions 83, 83' at the center in the lengthwise direction of the arms shown in FIG. 8 by evaporation. The ordinate and the abscissa are defined in the same way as in FIG. 10. As understood from FIG. 11, the frequency of the torsional mode decreases in the case the masses are deposited on the tops of the arms in the width direction, and the frequency of the same increases in the case the masses are deposited on the center of the arms in the width direction. As a practical matter, the amount of frequency change of the torsional mode is exceedingly small in the case the masses are deposited on the oblique lined positions 83 and 83' shown in FIG. 2.

Figure 12:
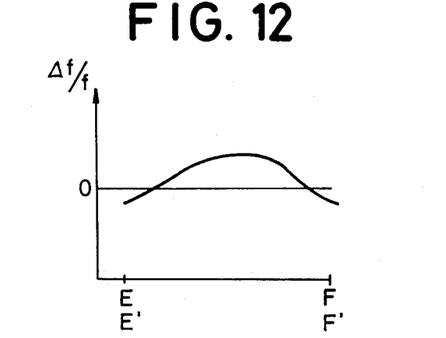

FIG. 12 shows the frequency change of the torsional mode in the case the masses are deposited on the oblique lined portions 84, 84' near the upper crotch of the arms shown in FIG. 8 by evaporation. The ordinate and the abscissa are defined in the same way as in FIG. 10. As understood from FIG. 12, the frequency of the torsional mode slightly decreases in the case the masses are deposited on the tops of the arms in the width direction, and the frequency of the torsional mode increases in the case the masses are deposited on the center of the arms in the width direction. As a whole, the frequency of the torsional mode increases in the case the masses are deposited on the oblique lined portions 84, 84' shown in FIG. 8 by evaporation.

Thus the amount of frequency change of the torsional mode caused by the deposition of the masses is relative to the position of the masses on the arms in the width direction as well as in the lengthwise direction.

Figures 13, 15:
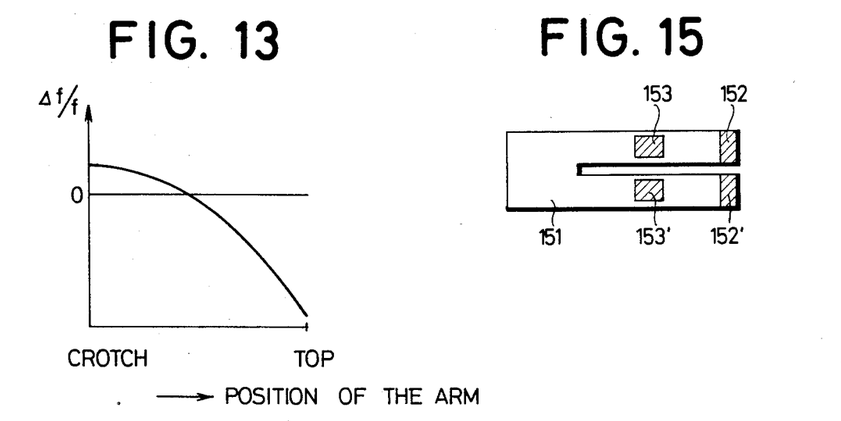
FIG. 13 is a characteristic diagram showing the positions of the masses evaporated on the arms in the lengthwise direction and the frequency change of the torsional mode of the quartz tuning fork.
FIG. 15 is a plan view of a quartz tuning fork showing the positions of the masses according to the present invention.

FIG. 13 shows the amount of frequency change of the torsional mode in the case the masses of the same amount having a fixed width are deposited on the crotch to the tops of the arms by evaporation. The frequency increases near the crotch and decreases at the tops of the arms. So that it is possible to zero the frequency change of the torsional mode in the case the masses having appropriate width dimension are deposited on a certain position near the center of the arms in the lengthwise direction. Although the correct position to deposit the masses on the arms to zero the frequency change of the torsional mode is different according to the shape and dimension of each tuning fork, the position necessarily locates between the node and the crotch of the flexural mode in the case the secondary flexural mode is utilized.

Figure 14:
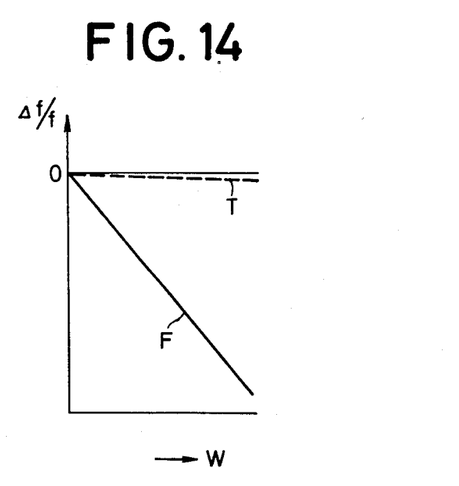
FIG. 14 is a characteristic diagram showing the frequency change of the flexural mode and the torsional mode according to the amount of the masses evaporated near the center of the arms of the quartz tuning fork.

FIG. 14 shows the frequency change of the flexural mode and the torsional mode in the case the masses of a certain width dimension are deposited near the center of the arms in the lengthwise direction of the second flexural mode by evaporation. The ordinate indicates the frequency changes $\Delta f/f$ and the abscissa indicates the amount of masses W. The solid line F indicates the frequency change $\Delta f/f$ of the flexural mode and the broken line T indicates the frequency change $\Delta f/f$ of the torsional mode. The amount of frequency change of the flexural mode is very large and that of the torsional mode is almost zero.

The present invention is characterized in that the masses are deposited near the center of the arms in the lengthwise direction to adjust the oscillating frequency of the flexural mode, and there is more than one mass mounted on the other positions to adjust the frequency of the torsional mode. Several masses for adjusting the frequency of the torsional mode can be deposited anywhere if the frequency thereof can be changed. However, the tops of the arms are most suitable to deposit the masses for effectively changing the frequency of the torsional mode as shown in FIG. 13.

FIG. 15 illustrates an embodiment of the present invention shows the positions to deposit the masses on the quartz tuning fork utilizing the coupling between the second flexural mode and the fundamental torsional mode. Reference numeral 151 denotes a quartz tuning fork, 152 and 152' denote the positions to deposit the masses on the tops of the arms, and 153 and 153' denote the positions to deposit the masses near the center of the arms in the lengthwise direction. The positions 153 and 153' are selected between the node of the second flexural mode and the crotch of the tuning fork.

Figure 16:
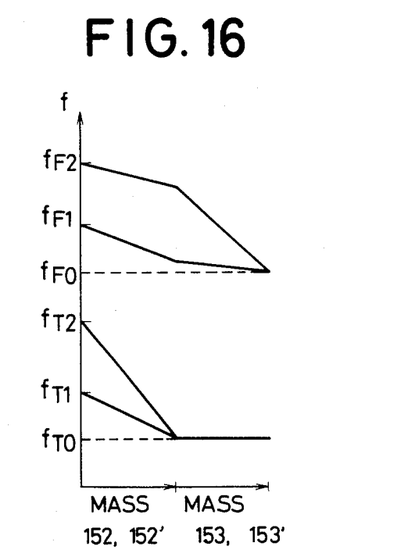
FIG. 16 is a characteristic diagram showing the frequency change of the flexural mode and the torsional mode in the case the masses are deposited on the two positions shown in FIG. 15 in turn by evaporation.

FIG. 16 shows the frequency adjustment condition of the present invention by depositing the masses on 152, 152', 153 and 153' shown in FIG. 15 by evaporation. The ordinate indicates the frequency and the abscissa indicates the amount of the masses evaporated on the positions 152 and 152' and the amount of the masses evaporated on the positions 153 and 153' connected in series. The symbols $fF_0$, $fF_1$, $fF_2$, $fT_0$, $fT_1$ and $fT_2$ are defined in the same way as in FIG. 3. Initially, the masses (Au) are evaporated on 152 and 152' at the tops of the arms to set the frequency of the torsional mode at the desired value $fT_0$. On this occasion, the frequency of the flexural mode also decreases but the dispersion in frequency of the completed tuning fork remains substantially as it is. Then the masses (Au) are evaporated on 153 and 153' to set the frequency of the flexural mode at the desired value $fF_0$. The frequency of the torsional mode which has been already set at the desired value $fT_0$ does not change at all in the case of frequency adjustment of the flexural mode. Namely the frequencies of the flexural mode and the torsional mode of a number of tuning forks are respectively set at $fF_0$ and $fT_0$, and the dispersion in each frequency is almost zero. Accordingly, in the case the masses are deposited on the positions pointed out in the present invention to adjust the frequencies of the flexural mode and the torsional mode, the difference in frequency between the flexural mode and the torsional mode is sufficiently controlled at the desired value. As the result, the dispersion in the frequency-temperature characteristic is reduced, and the rate of acceptance is largely improved. Moreover, since the frequency of the flexural mode does not disperse by itself, a logic circuit to compensate for the dispersion is not needed, and the IC structure is not complicated.

The present invention has been illustrated with respect to the tuning fork utilizing the coupling between the second flexural mode and the fundamental torsional mode. In the tuning fork utilizing the coupling between the fundamental flexural mode and the fundamental torsional mode, however, only the frequency of the flexural mode changes and the frequency of the torsional mode only slightly changes by the masses deposited near the center of the arms in the lengthwise direction. The explanation regarding the frequency adjustment of the present invention in connection with FIGS. 15 and 16 can also be applied to the tuning fork utilizing the coupling between the fundamental flexural mode and the fundamental torsional mode. Namely, the frequency adjustment of the torsional mode by depositing the masses at, for instance, the tops of the arms in the present invention realizes a sufficient amount of frequency change of the torsional mode to absorb the dispersion in the thickness dimension. The present invention eliminates the drawbacks of the conventional type illustrated in FIGS. 1 to 3.

Now the detailed structure of the present invention will be illustrated.

Figure 17:
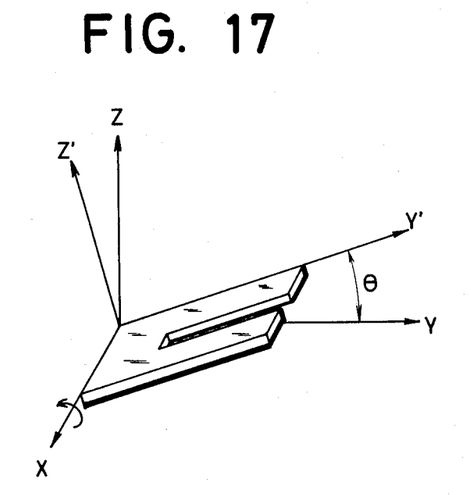
FIG. 17 is a perspective view showing the directions of a quartz resonator.

FIG. 17 shows the directions of the quartz resonator. X, Y and Z respectively denote the electrical axis, the mechanical axis and the optical axis of the quartz. The figure shows the resonator whose lengthwise direction, width direction and thickness direction are respectively the Y-axis, X-axis and Z-axis rotated around the X-axis by $\theta$. The lengthwise direction, width direction and thickness direction of the resonator are in the directions of the Y'-axis, X-axis and Z'-axis after the rotation.

Figure 18A:
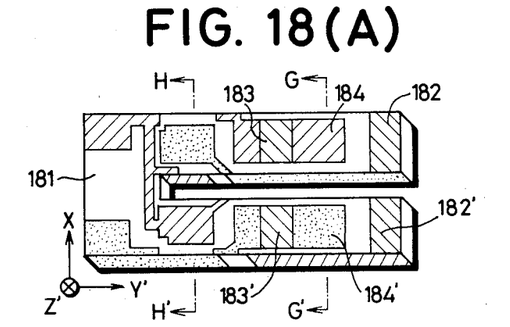
FIG. 18(A) is a perspective view showing the electrode arrangement of the quartz tuning fork and the position of the masses according to the present invention.
Figure 18B:
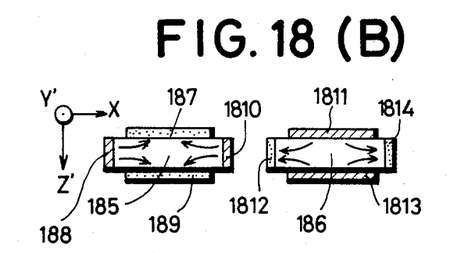
FIGS. 18(B) and 18(C) are respectively sectional views taken on line G—G' and line H—H' in FIG. 18(A)
Figure 18C:
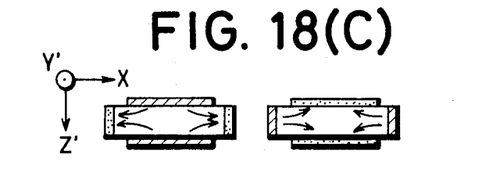

FIG. 18(A) shows the electrode arrangement and the position of the masses for frequency adjustment of the quartz tuning fork according to the present invention utilizing coupling between the second flexural mode and the fundamental torsional mode. The lengthwise direction, width direction and thickness direction of a quartz tuning fork 181 are respectively the Y'-axis, X-axis and Z'-axis shown in FIG. 17. The electrodes deposited on the oblique lined portions and the dotted portions are of inverse phase. FIG. 18(B) shows a sectional view of the arms taken on line G—G' of FIG. 18(A). Numerals 185 and 186 denote sections of the two arms. In the case electrodes 187, 189, 1812 and 1814 are in-phase, electrodes 188, 1810, 1811 and 1812 are in-phase, and the electrodes 187 and 188 are of inverse phase, an electric field is applied inside the arms in the directions indicated by the arrow marks. FIG. 18(C) shows a sectional view of the arms taken on line H—H' of FIG. 18(A). The electric field is applied in the directions shown by the arrow marks inside the arms. In this way, the directions of the electric field inside the sections taken respectively on lines G—G' and H—H' are different in one arm. The second flexural mode is excited by the electrode arragement shown in FIG. 18(A). The portions shown by the oblique line 182, 182', 183 and 183' denote the positions to deposite the masses by evaporation. The position 182 locates on a lead electrode to connect the electrodes 1812 with the electrode 1814 on the side surfaces of the arms in FIG. 18(B), and the position 182' locates on a lead electrode to connect the electrode 188 with the electrode 1810 on the side surfaces of arms in FIG. 18(B). The position 183 is a part of the electrode 184 and the position 183' is a part of the electrode 184'. The masses are deposited on the top of arms 182 and 182' by evaporation for frequency adjustment of the torsional mode. The masses are deposited on 183 and 183' near the center of the arms in the lengthwise direction by evaporation for frequency adjustment of the flexural mode.

Figure 19A:
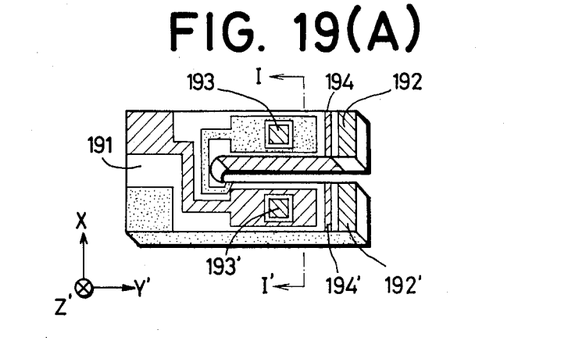
FIG. 19(A) is a perspective view showing the electrode arrangement of the quartz tuning fork and the positions of the masses according to the present invention.
Figure 19B:
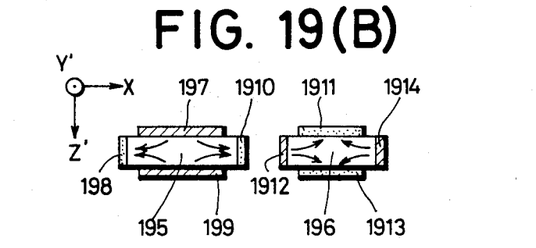
FIG. 19(B) is a sectional view taken on line I—I' of the arm of the tuning fork in FIG. 19(A)

FIG. 19(A) shows the electrode arrangement and the position of the masses for frequency adjustment of the quartz tuning fork according to the present invention utilizing coupling between the fundamental flexural mode and the fundamental torsional mode. The lengthwise, width and thickness directions of the quartz tuning fork are the same as in FIG. 18. In FIG. 19(A), the electrodes deposited on the oblique lined portion are of inverse phase to the electrodes deposited on the dotted portion. FIG. 19(B) shows a sectional view of the arms taken on line I—I' of FIG. 19(A). Numerals 195 and 196 denote sections of the two arms. In the case electrodes 197, 199, 1912 and 1914 are in-phase, electrodes 198, 1910, 1911 and 1913 are in-phase and electrodes 197 and 198 are inverse phase, the electric field is applied inside the arms in the directions indicated by the arrow marks. Numeral 194 in FIG. 19(A) denotes a lead electrode to connect the electrode 1912 with the electrode 1914 on the side surfaces of the arms. Numeral 194' in FIG. 19(A) is a lead electrode to connect the electrode 198 with the electrode 1910 on the side surfaces of the arms. The fundamental flexural mode is excited by the electrode arrangment shown in FIGS. 19(A) and 19(B). Oblique lined portions 192, 192', 193 and 193' denote the positions to deposit the masses. These masses are previously deposited, and the frequency adjustments of the flexural mode and the torsional mode are carried out by scattering the masses by laser. The masses 192 and 192' at tops of arms are for frequency adjustment of the torsional mode. The masses 193 and 193' near the center of the arms in the lengthwise direction are for frequency adjustment of the flexural mode.

Figure 20:
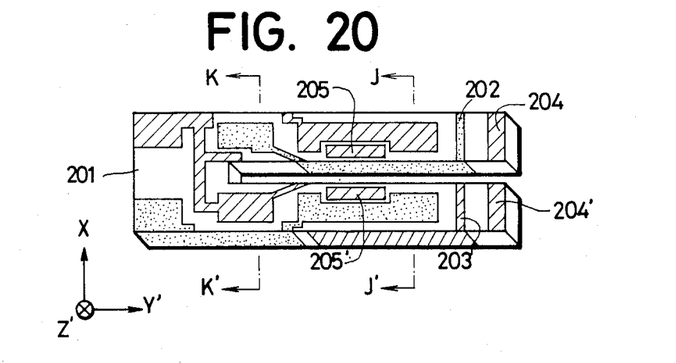
FIG. 20 is a perspective view showing the electrode arrangement of the quartz tuning fork and the position of the masses according to the present invention.

FIG. 20 shows the electrode arrangement and the position of the masses for frequency adjustment of the quartz tuning fork according to the present invention utilizing coupling between the second flexural mode and the fundamental torsional mode. The lengthwise, width and thickness directions of a quartz tuning fork 201 is the same as in FIG. 18. In FIG. 20 the electrodes on the oblique lined portions are of inverse phase to the electrodes on the dotted portions. The sectional views of the arms taken on lines J—J' and K—K' in FIG. 20 are identical to the figures shown in FIGS. 18(B) and 18(C). Numerals 202 and 203 denote lead electrodes to connect the electrodes on both sides of each arm. Oblique lined portions 204, 204', 205 and 205' denote the positions to deposit the masses. These masses are previously deposited, and the frequency adjustment of the flexural mode and the torsional mode are carried out by scattering these masses by laser. The masses 204 and 204' at the tops of arms are for frequency adjustment of the torsional mode. The masses 205 and 205' near the center of the arm in the lengthwise direction are for frequency adjustment of the flexural mode. The positions of the masses 205 and 205' are slightly different from the positions of the masses 183 and 183' shown in FIG. 18(A) in the lengthwise direction of the arms. However, the frequency of the torsional mode only slightly changes for both cases. While the masses 205 and 205' in FIG. 20 are positioned inside the arms in the width direction, it is to be noted that the same effect of the present invention is kept by depositing the masses on the outside of the arms, or both the outside and inside of the arms.

While the quartz resonator has been illustrated by way of an embodiment of the present invention, the same effect can be made by a tuning forks utilizing coupling between the flexural mode and the torsional mode regardless of the materials of the resonator. Therefore the present invention is not restricted to the quartz resonator.

As illustrated in detail, the present invention relating to the tuning fork utilizing the coupling between the flexural mode and the torsional mode has the following great advantages:

(1) The frequency of the flexural mode can be sufficiently changed by depositing the masses near the center of the arms, and the frequency of the torsional mode can be sufficiently changed by depositing the masses on other portions of the arms.

(2) Only the frequency of the flexural mode can be changed by the masses deposited near the center of the arms in the lengthwise direction with little changing of the frequency of the torsional mode, whereby the difference in frequency of the two modes can be controlled accurately.

(3) Consequently, the tuning forks having sufficiently controlled and excellent frequency-temperature characteristic are produced on a large scale.

I claim:

1. A tuning fork type resonator utilizing coupling between the flexural mode of vibration and the torsional mode of vibration, comprising: a tuning fork body having a pair of vibratable arms; a first mass deposited on an intermediate portion between the free end and the fixed end of each arm, the first masses being positioned on the intermediate portions of the arms at positions wherein addition or reduction of the amount of the first masses does not effect a change of the frequency of the torsional mode of vibration and does effect a variation of the frequency of the flexural mode of vibration; and a second mass deposited at least on one other portion of each arm, the second masses being positioned at positions wherein addition or reduction of the amount of the second masses effects a variation of the frequency of the torsional mode of vibration.

2. A tuning fork type resonator as claimed in claim 1; wherein the resonator is composed of quartz crystal.

3. A tuning fork type resonator as claimed in claim 2; wherein the first masses are deposited near the center of the tuning fork arms in the lengthwise direction thereof.

4. A tuning fork type resonator as claimed in claim 2; wherein the second masses are deposited at the free end portions of the arms in the lengthwise direction thereof.

5. A tuning fork type resonator as claimed in claim 2; wherein both the flexural mode and the torsional mode are the fundamental modes of vibration of the tuning fork arms.

6. A tuning fork type resonator as claimed in claim 2; wherein the flexural mode is the second mode of vibration and the torsional mode is the fundamental mode of vibration of the tuning fork arms.

7. A tuning fork type resonator as claimed in claim 6; wherein the first masses are positioned between a vibrational node of the second flexural mode of vibration and the fixed ends of the arms.

8. A tuning fork type resonator as claimed in claim 2; wherein the first masses have a width dimension in the width direction of the arms such that addition or reduction of the first masses over the width of the arms effects no frequency change of the torsional mode.

9. A tuning fork type resonator as claimed in claim 2; wherein the first and second masses are isolated from electrodes disposed on surface portions of the resonator.

10. A tuning fork type resonator as claimed in claim 1; wherein the first masses are deposited near the center of the tuning fork arms in the lengthwise direction thereof.

11. A tuning fork type resonator as claimed in claim 1; wherein the second masses are deposited at the free end portions of the arms in the lengthwise direction thereof.

12. A tuning fork type resonator as claimed in claim 1; wherein both the flexural mode and the torsional mode are the fundamental modes of vibration of the tuning fork arms.

13. A tuning fork type resonator as claimed in claim 1; wherein the flexural mode is the second mode of vibration and the torsional mode is the fundamental mode of vibration of the tuning fork arms.

14. A tuning fork type resonator as claimed in claim 13; wherein the first masses are positioned between a vibrational node of the second flexural mode of vibration and the fixed ends of the arms.

15. A tuning fork type resonator as claimed in claim 1; wherein the first masses have a width dimension in the width direction of the arms such that addition or reduction of the first masses over the width of the arms effects no frequency change of the torsional mode.

16. A tuning fork type resonator as claimed in claim 1; wherein the first and second masses are isolated from electrodes disposed on surface portions of the resonator.

17. A tuning fork type resonator utilizing coupling between the flexural mode of vibration and the torsional mode of vibration, comprising: a tuning fork body having a pair of vibratable arms each having a fixed end and a free end; a pair of end masses each disposed adjacent the free end of a respective one of said vibratable arms, each of said end masses having a mass value effective for setting the torsional mode of vibration of the respective one of said vibratable arms to a desired frequency value; and a pair of intermediate masses each disposed on a respective one of said vibratable arms at a position generally midway between the fixed end and the free end of the respective one of said vibratable arms, each of said intermediate masses having a mass value effective for setting the flexural mode of vibration of the respective one of said vibratable arms to a desired frequency value, and each of said intermediate masses being located at a position which is ineffective to alter the frequency value of the torsional mode of vibration.

18. A tuning fork type resonator as claimed in claim 17; wherein said end masses are dimensioned and positioned to set the frequency of the fundamental torsional mode of vibration, and said intermediate masses are dimensioned and positioned to set the frequency of the fundamental flexural mode of vibration.

19. A tuning fork type resonator as claimed in claim 17; wherein said end masses are dimensioned and positioned to set the frequency of the fundamental torsional mode of vibration, and said intermediate masses are dimensioned and positioned to set the frequency of the second flexural mode of vibration.

20. A tuning fork type resonator as claimed in claim 17; wherein the tuning fork type resonator is composed of quartz crystal.

* * * * *